(12) United States Patent
Lewis et al.

(10) Patent No.: US 6,201,708 B1
(45) Date of Patent: Mar. 13, 2001

(54) BACKPLANE SLOT ARRANGEMENT FOR USE WITH SINGLE OR MULTIPLE WIDTH CIRCUIT BOARDS

(75) Inventors: Neal W. Lewis, Raleigh; Lawrence F. Bizga, Durham; John R. Moseby, Chapel Hill; Franklin A. Lynch, Raleigh, all of NC (US)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/461,615

(22) Filed: Dec. 15, 1999

(51) Int. Cl.[7] .................................................. H01R 12/16
(52) U.S. Cl. ............................................................ 361/788
(58) Field of Search ................................... 361/785, 788; 439/61

(56) References Cited

U.S. PATENT DOCUMENTS

| | | | | |
|---|---|---|---|---|
| 4,700,274 | * | 10/1987 | Laut ...................................... | 361/788 |
| 5,603,044 | * | 2/1997 | Annapareddy et al. .............. | 361/788 |
| 5,930,119 | * | 7/1999 | Berding ................................ | 361/788 |

* cited by examiner

*Primary Examiner*—Neil Abrams
(74) *Attorney, Agent, or Firm*—J. Erik Fako

(57) ABSTRACT

A pin connection arrangement spanning a series of slots on a backplane 1 printed circuit board. The arrangement allows replaceable printed circuit board assemblies to be paired or mated while further allowing the printed circuit board assemblies to vary incrementally in width. The printed circuit board assemblies can be one slot wide 10a, 10b, two slots wide, 12a, 12b, three slots wide, 14a, 14b, on up to 'n' slots wide while being paired to a mate for sparing purposes. Backplane 1 provides a direct connection between paired printed circuit boards. The arrangement(s) allow expansion of printed circuit board area and volume while supporting paired applications that require only a single slot for a backplane connection per printed circuit board. Backplane 1 can be used for different width printed circuit board assemblies. This is accomplished by a series of pin connectors 18 and traces 16 on backplane 1 that link slot pairs (single wide), every other pair (double wide), every third pair (triple wide), and so forth to the desired level of printed circuit board width.

4 Claims, 3 Drawing Sheets

BACKPLANE SLOT ARRANGEMENT FOR USE WITH SINGLE OR MULTIPLE WIDTH CIRCUIT BOARDS

FIELD OF THE INVENTION

The present invention relates generally to a backplane slot arrangement and more particularly to a backplane slot arrangement capable of accommodating printed circuit boards wider than a single slot.

BACKGROUND OF THE INVENTION

Shelf assemblies are often used to house printed circuit boards (PCBs) also referred to as cards. The printed circuit boards are inserted into a card cage assembly engaging a perpendicularly oriented backplane that is also a printed circuit board. Proper engagement provides electrically conductive paths that connect circuits between or among removable printed circuit boards. The card cage and backplane assembly make insertion and extraction of printed circuit boards simple for purposes of replacement, service, etc. Slots in the card cage assembly hold the inserted printed circuit boards in place. In addition, pin connectors at specific locations on the backplane also ensure engagement of the printed circuit boards with the backplane. Because pin connector locations are specific, a volumetric limit is imposed on each removable printed circuit board thus limiting the size of a printed circuit board that can be inserted in a given backplane slot.

Certain applications require "sparing" of circuits to ensure that critical equipment remains functional even in the case of a fault. A fault could occur on a communication access port, processor complex, or other critical resource. Often the single slot practice of sparing or "1:1 or 1+1 protection" is used to ensure that the process continues without an interruption of service. Pairing certain printed circuit board assemblies provides the redundancy needed to support these critical functions.

What is needed is a backplane arrangement that can support insertion of printed circuit boards wider than a single slot while maintaining specific connections between or among slots so that printed circuit boards of varying slot width can be paired with respect to one another.

SUMMARY OF THE INVENTION

The present invention is comprised of a pin connection arrangement or multiple pin connection arrangements on a backplane printed circuit board. The arrangement(s) allow field replaceable printed circuit boards to be paired with one another while further allowing the printed circuit boards to vary incrementally in width. The printed circuit boards can be one, two, three, on up to 'n' slots wide. The backplane provides a direct connection between paired printed circuit boards. The arrangement(s) allow expansion of printed circuit board area and volume while supporting paired applications that require only a single slot per printed circuit board. The backplane can be used for differently sized printed circuit boards. This is accomplished by a series of pin connections on the backplane that link slot pairs (single wide), every other pair (double wide), every third pair (triple wide), and so forth to the desired level of printed circuit board width.

In accordance with one embodiment of the present invention is a pin connector trace arrangement on a backplane printed circuit board. The backplane spans a plurality of slots of a card cage assembly. The pin connector arrangement is comprised of pin connector traces on the backplane connecting an $m^{th}$ slot and an $m^{th}+n$ slot. The pin connector traces operatively connect and pair "n" slot width printed circuit boards.

In accordance with another embodiment of the present invention is an interleaved pin connector trace arrangement for each four slot increment on a backplane printed circuit board. The backplane pin connector traces connect the first and third slots together and the second and fourth slots together. The pin connector traces operatively connect and pair single slot width or double slot width printed circuit boards within a card cage assembly.

Other aspects and features of the present invention will become apparent to those ordinarily skilled in the art upon review of the following description of specific embodiments of the invention in conjunction with the accompanying figures.

DETAILED DISCLOSURE OF THE EMBODIMENTS

Figure 1:
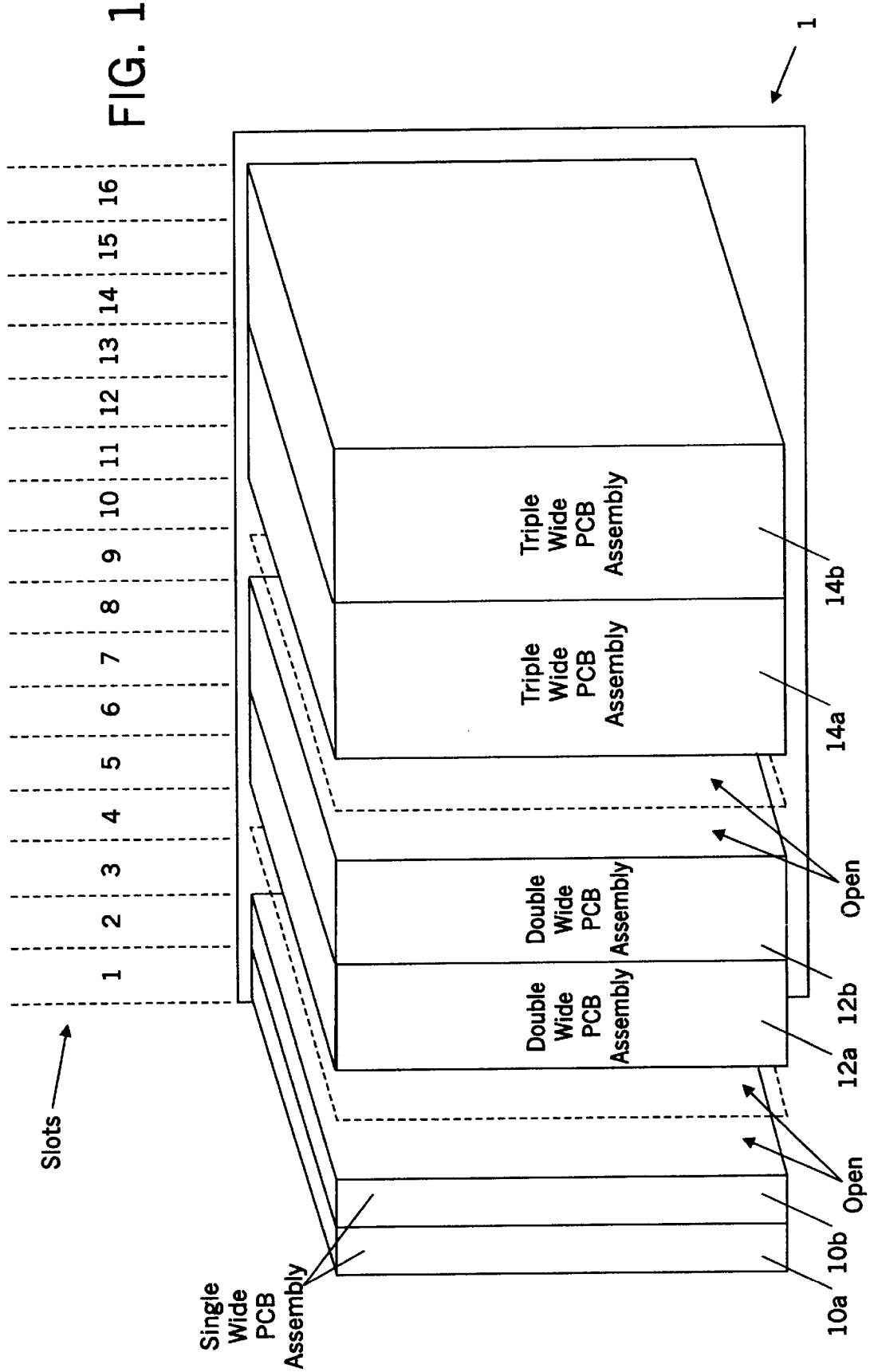
FIG. 1 illustrates single, double, and triple width paired printed circuit board assemblies connected to a backplane.

FIG. 1 illustrates single 10a 10b, double 12a 12b, and triple 14a 14b wide printed circuit boards connected to a backplane 1. A single wide 10a or 10b is a single printed circuit board designed to be inserted into a card cage (not shown) and connected to backplane 1. The double 12a 12b and triple 14a 14b wide printed circuit boards show that size and volume are increased incrementally. The double 12a 12b and triple 14a 14b wide printed circuit boards can be multiple printed circuit boards stacked in a "daughter board" arrangement where the daughter boards are arranged inside the volume such as disk drives, amplifiers or any devices which require a large volume to take advantage of the limited space available.

Figure 2:
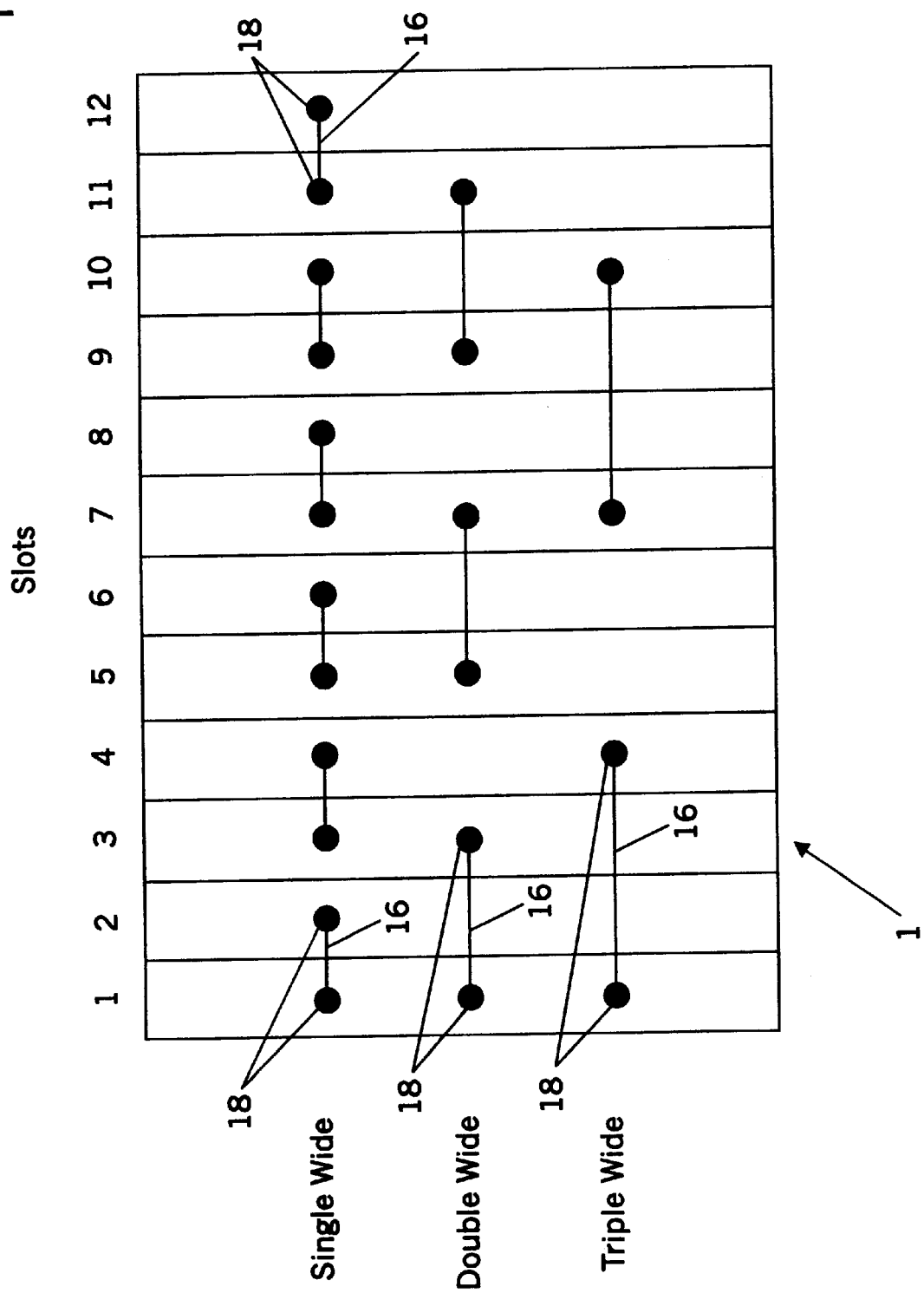
FIG. 2 illustrates backplane pin connections for single, double, and triple width paired printed circuit board assemblies.

FIG. 2 illustrates pin connections for single (n=1), double (n=2), and triple (n=3) wide printed circuit board arrangements on a single backplane 1. As is evident from FIG. 2, each arrangement covers a 2n slot block. A 2n slot block refers to double the number of slots taken up by a main printed circuit board assembly. Thus, a double wide (n=2) arrangement will use four (4) slots of backplane 1. Similarly, a triple wide (n=3) arrangement will use six (6) slots of backplane 1. In addition, the main printed circuit board assembly and its mate occupy consecutive slots. Thus, for a double wide arrangement, four (4) consecutive slots will be occupied by two double wide printed circuit board assemblies.

For single wide printed circuit board applications, slots one and two, three and four, five and six, seven and eight, etc. can be hard-wired together using traces 16 between pin connectors 18 on backplane 1. For double wide printed circuit board applications, slots one and three, five and seven, nine and eleven, etc. can be hard-wired together using traces 16 between pin connectors 18 on backplane 1. Still further, slots one and four, seven and ten, etc. can be hard-wired together using traces 16 between pin connectors 18 on backplane 1 for triple wide printed circuit board applications.

All connections engaging the printed circuit board assemblies and backplane 1 can be made using a dedicated array of connection pins 18 on both the printed circuit board assemblies and backplane 1. Connection pins 18 are fixed to backplane 1 within each slot and serve to operatively connect a printed circuit board assembly to backplane 1 when a printed circuit board assembly having complimentary connector pin receiving means is inserted into a given backplane slot. Traces 16 on backplane 1 provide the ability to connect and pair with one another single wide, double wide, and triple wide field replaceable printed circuit board assemblies in appropriate slots. A redundant printed circuit board assembly is then paired with its equivalent mate for purposes of hot stand by, sharing of traffic, or any other application that requires high integrity connections between mated pair(s).

For instance, a triple wide printed circuit board can be inserted into a card cage assembly occupying slots one through three. Its mate is then inserted into the card cage assembly occupying slots four through six. A trace 16 between pin connectors 18 on backplane 1 between slot one and slot four achieves the mating between the two triple wide printed circuit boards. Pin connectors 18 on the backplane corresponding to slots two, three, five, and six go unused since the triple wide board only utilizes the left most slot pin connector 18 for each printed circuit board assembly.

Double wide printed circuit boards occupy two slots each. According to FIG. 2, double wide printed circuit board pairs can occupy slots one through four, five through eight, nine through twelve, etc. The backplane pin traces 16 for double wide printed circuit boards run from slot one to three, slot five to seven, slot nine to eleven, etc.

Lastly, single wide printed circuit board pairs are accommodated using backplane traces 16 between slots one and two, three and four, five and six, etc.

The above approach can be readily extrapolated to four slot wide, five slot wide, six slot wide, on up to 'n' slot wide printed circuit boards by those of ordinary skill in the art.

Figure 3:
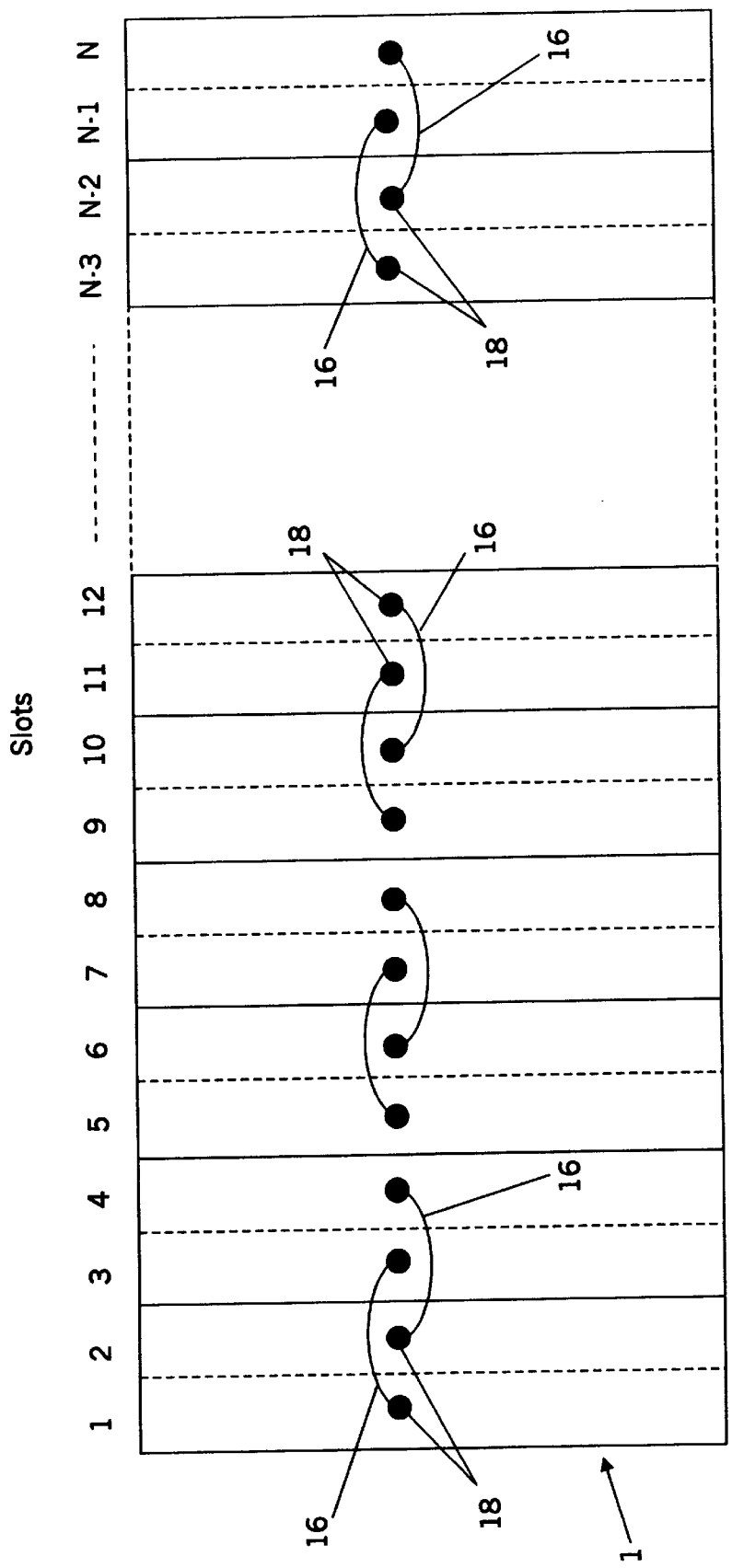
FIG. 3 illustrates backplane pin connections for a preferred embodiment of the present invention.

FIG. 3 illustrates a preferred embodiment of the present invention. A series of pin connectors 18 and traces 16 on backplane 1 between slot pairs support both single and double wide printed circuit boards.

A backplane pin connector 18 arrangement interleaves pin connections in order to eliminate wasted (unusable) slots without wasting connector pins 18 and reduces connection pin requirements by utilizing one set of pins for all printed circuit board assemblies. Slots one and three are paired, as are slots two and four, and so forth across backplane 1. Preferably, pin connectors 18 are positioned identically on each slot of backplane 1. Identically positioning pin connectors means that pin connectors are generally located in the same horizontal and vertical position on each slot thereby creating a generally consistent location for pin connectors relative to each slot. The identical positioning allows the use of single or double wide printed circuit board assemblies by providing a consistent pin connector array for replaceable printed circuit board assemblies.

For double wide printed circuit boards, only the pin connectors 18 corresponding to odd numbered slots are employed. That is, slots one and three, slots five and seven, slots nine and eleven, on up to slots "N–3" and "N–1", are utilized. The pin connectors 18 corresponding to even numbered slots are not utilized since a double wide printed circuit board will only utilize pin connectors 18 in the left most slot.

For single wide printed circuit boards, all of the pin connectors 18 are employed in an interleaved fashion. Thus, slots one and three are paired as are slots two and four and so on. Thus, two single wide printed circuit board assemblies are inserted alternately, rather than side by side, in order to pair them together on backplane 1.

The interleaved pattern permits the use of single and double wide printed circuit boards in the same card cage assembly. Moreover, double and single wide printed circuit boards can even be used within the same shelf assembly. A shelf assembly or rack is one row of printed circuit boards within a stacked card cage assembly. For instance, double wide printed circuit boards may be paired in slots one through four and nine through twelve while single wide printed circuit boards can be paired in slots five and seven and six and eight.

Connections between printed circuit board assemblies and backplane 1 at each slot use a consistent array of connector pins across backplane 1. The pin connector 18 arrangement is identical for each slot so that identical printed circuit boards can be inserted into each of the paired slots. The printed circuit boards can be one slot or two slots wide and the pin connections 18 can be made between paired slots regardless of whether the printed circuit boards are one or two slots wide.

The preferred embodiment thus defines an implementation that minimizes the number of pins required to support one or two slot wide printed circuit boards. This is desirable because it doubles the useful printed circuit board area, volume and potential heat dissipation available (as opposed to single slot practice) without requiring additional connector pins.

The above description refers to a backplane that accepts field replaceable printed circuit boards. The present invention could also be implemented, by those of ordinary skill in the art, without a backplane but rather with discrete wires and "panel mount connectors" mounted to the card cage.

One advantage of the present invention is that wider printed circuit boards allow for more usable circuit area via a board parallel to the main printed circuit board assembly or extra volume for large or tall components.

Another advantage is that higher heat dissipation can be achieved with the increased volume. In modern electronic systems, heat must be removed from electronic components to ensure proper operation. In many cases, heat dissipation requirements limit the density of the electronic components on field replaceable printed circuit boards. When a multi-printed circuit board field replaceable unit is employed, the increased area available on the daughter boards provide the ability to spread components, and therefore heat dissipation, across multiple printed circuit boards or across a larger volume. This is desirable because for a given cooling system capacity or air flow velocity, the amount of heat dissipation that can be achieved for a given temperature rise is directly dependent upon the volumetric flow rate of cooling fluid (usually air) that passes through the volume.

In addition to increasing the printed circuit board area for heat dissipation, an increased width arrangement provides additional component height. The key benefit of this is that it allows the addition of taller heat sinks. The addition of a taller heat sink allows a higher heat flux to be dissipated from a given (small) component, which may have to dissipate a large amount of heat from a small surface area. In many side by side paired printed circuit board applications this limits the ability of the card pair to use high heat flux components since the required heat sink may not fit in a single wide slot. According to the present invention, a wider configuration with taller heat sinks can be used. As a result, higher heat flux components can be implemented while still supporting card pairing or mating.

Yet another advantage of the present invention is that the backplane will remain useful longer even with continually shrinking circuit technology. Double or triple wide printed circuit boards may be shrunk through technology advances to single wide in the future thereby allowing additional and/or newer printed circuit boards to be inserted into an existing shelf.

Another advantage is that shelf mechanics are consistent from slot to slot except for connector pin arrangements. As a result, printed circuit boards can be located in any slot fit for a particular width.

Still another advantage is that faceplates are often applied to printed circuit boards. Consistent shelf mechanics allow a single approach for printed circuit board extraction mechanics and EMI shielding to be used for printed circuit boards of all widths.

Yet another advantage is that pairing is achieved for single and double wide printed circuit boards without an increase in connector pins.

It is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A backplane having a plurality of slots for accommodating multiple slot width circuit boards comprising:
    (a) a plurality of pin connections disposed in the slots for engaging the circuit boards; and
    (b) a plurality of conductors, in electrical communication with the pin connections, for electrically connecting selected pin connections corresponding to an input of selected mated circuit boards, having a width of n slots, wherein each said conductor spans n+1 slots, bypassing pin connections not corresponding to the selected mated circuit boards.

2. A backplane having a plurality of slots for accommodating multiple slot width circuit boards comprising:
    (a) a plurality of pin connections disposed in the slots for engaging the circuit boards; and
    (b) a plurality of conductors, in electrical communication with the pin connections, for electrically connecting selected pin connections corresponding to an input of selected mated circuit boards, having a width of n slots, wherein each said conductor spans n+2 slots, bypassing pin connections not corresponding to the selected mated circuit boards.

3. A method for accommodating multiple slot width circuit boards in a backplane having a plurality of slots comprising:
    (a) providing a plurality of pin connections for engaging a circuit board;
    (b) connecting selected pin connections corresponding to an input of selected mated circuit boards, having a width of n slots, wherein the connection spans n+1 slots; and
    (c) bypassing pin connections not corresponding to the mated circuit boards.

4. A method for accommodating multiple slot width circuit boards in a backplane having a plurality of slots comprising:
    (a) providing a plurality of pin connections for engaging a circuit board;
    (b) connecting selected pin connections corresponding to an input of selected mated circuit boards, having a width of n slots, wherein the connection spans n+2 slots; and
    (c) bypassing pin connections not corresponding to the mated circuit boards.

* * * * *